United States Patent [19]
Lau et al.

[11] Patent Number: 5,302,948
[45] Date of Patent: Apr. 12, 1994

[54] OBJECT POINTER COMPUTER INPUT APPARATUS

[76] Inventors: Clifford B. Lau, 94-871 Farrington Highway, 2nd Floor, Waipahu, Hi. 96797-3146; Marian S. Gould, 13 Elm St., Albany, N.Y. 12202

[21] Appl. No.: 770,453

[22] Filed: Oct. 3, 1991

[51] Int. Cl.$^5$ ............................................. H03M 11/26
[52] U.S. Cl. ........................................ 341/31; 341/20; 250/222.1; 250/561; 209/577; 209/900
[58] Field of Search ........................... 341/31, 28, 20; 209/576, 577, 900; 250/214 AL, 221, 222.1, 561, 227.22; 340/712

[56] References Cited

U.S. PATENT DOCUMENTS

| | | | |
|---|---|---|---|
| 3,207,905 | 9/1965 | Bray | 341/31 |
| 3,372,789 | 3/1968 | Thiele et al. | 341/31 |
| 3,553,680 | 1/1971 | Cooreman | 341/31 |
| 3,673,579 | 6/1972 | Graven | 341/31 |
| 3,737,668 | 6/1973 | Ellis et al. | 341/31 |
| 4,329,561 | 5/1982 | Helfrich, Jr. et al. | 250/221 |
| 4,879,557 | 11/1989 | Roche | 341/31 |
| 4,912,337 | 3/1990 | Wilwerding | 250/561 |
| 4,937,443 | 6/1990 | Smoot | 341/31 |

*Primary Examiner*—Donald J. Yusko
*Assistant Examiner*—Michael Horabik
*Attorney, Agent, or Firm*—James Creighton Wray

[57] ABSTRACT

A computer input device uses an ordinary sheet material such as a card, letter or envelope to select and point to a symbol. A remote portion of the sheet material covers sensors which sense available ambient light. Uncovered sensors provide background light information. A single sensor is associated with multiple symbols and is associated with symbols in at least two specific groups of symbols. A processor is connected to a de-multiplexer and a multiplexer, and the demultiplexer and multiplexer are connected to individual sensors. Biasing resistors are connected to individual sensors. The processor selects a pair of connectors from the demultiplexer and multiplexer, thus sampling a particular sensor. The output of that sensor is converted a digital signal, which is sent to the processor and stored in a random access memory. After sufficient sensors have been interrogated, the processor provides an output which is particularly related to the sensor or group of sensors which are covered by the pointer sheet, and which is specifically related to a symbol pointed to by the pointer sheet. In one embodiment, the processor output is displayed as a particular information. In one embodiment, the processor output illuminates lamps over individual receiver bins to indicate the receiver bin in which the pointer piece should be deposited.

11 Claims, 4 Drawing Sheets

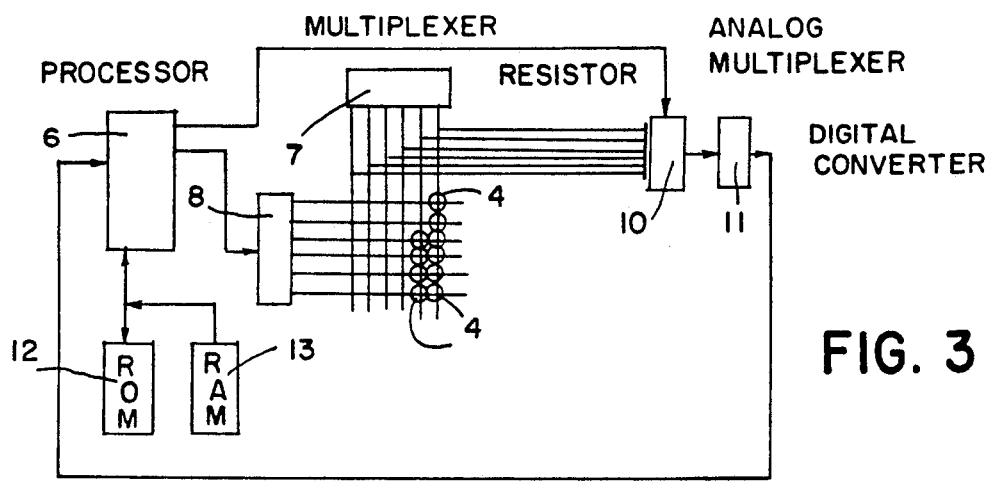
FIG. 3
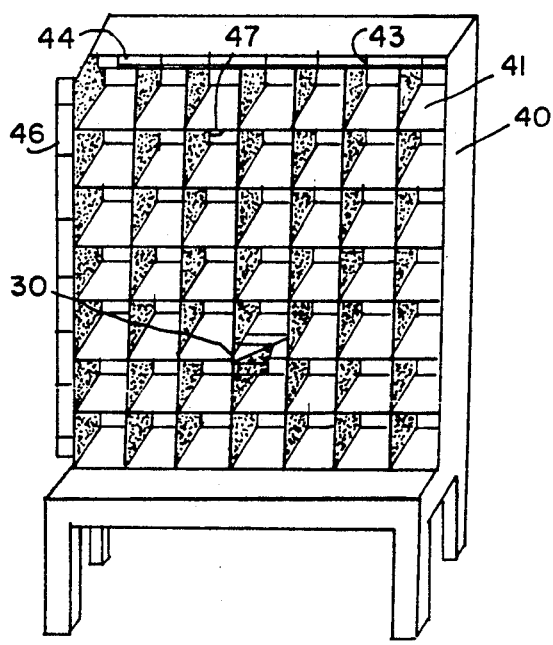
FIG. 6
FIG. 3a
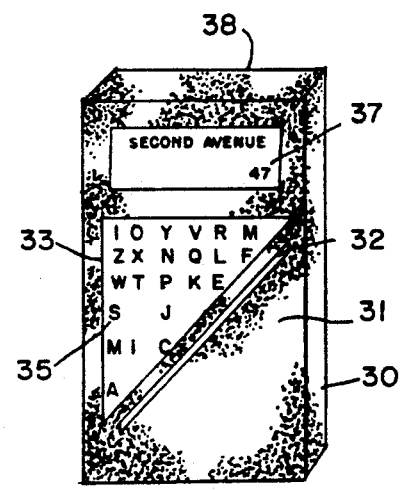
FIG. 6a

| 20 | 21 | 22 | 23 | 24 |
|---|---|---|---|---|
| 1 | 31 | 31 | 0 | |
| 2 | 35 | 35 | 0 | |
| 3 | 32 | 100 | 68 | X=3 |
| 4 | 33 | 104 | 71 | |
| 5 | 31 | 101 | 71 | |
| 6 | 31 | 103 | 72 | Y=6 |
| 7 | 32 | 33 | 1 | |
| 8 | 31 | 31 | 0 | |
| 9 | 32 | 32 | 0 | |
| 10 | 30 | 30 | 0 | |

FIG. 5

OBJECT POINTER COMPUTER INPUT APPARATUS

BACKGROUND OF THE INVENTION

This inventions concerns computer inputs, and particularly object pointer input devices.

Most prior art keyboard devices use the concept of discrete keys. The keys require interconnect wires implemented in a keyboard composed of multiple keys. One prior art device codes each key with multiple switches. The switches may be optical sensors. A group of one or more sensors is dedicated to a particular key. When a key closure occurs, the code of that key can be detected on the interconnect wires. The appearance and use of that prior art keyboard would be like any standard keyboard in use today. The implementation of the key electronics is the only difference. Mechanical keys are replaced with coded optical keys. Multiple sensors are involved in detecting a key. The use of multiple sensors for one key is inefficient. As an example, one device requires 36 sensors for 14 keys.

One prior art device requires a special light source in an enclosure. Multiple sensors make up a key, and each individual key must be uniquely fabricated and interconnected. Keys are not interchangeable.

In another keyboard which is similar because it uses the same discrete key concept, a switch is a single emitter-receiver sensor pair. The light path between the two is broken to produce a key closure.

One touch screen uses a finger or similar object to point to a location in a rectangular area. The rectangular area has optical transmitters and receivers on its boarders. Resolution is determined by the size of the object used for pointing.

Another prior art device uses optical sensors and detects coordinates. There are major differences in the technology and method used for determining coordinates in that device. A major portion is mechanical and uses motors, slotted belts and rotating drums to scan a defined area for an object. Parabolic mirrors concentrate lights that must span the x and y coordinates. Synchronization of the moving parts to electronic counters is required to determine coordinates. The rate of change if determined by the speed of the moving parts. Resolution is determined by the object used for pointing, the quality of the optics, and the mechanical-to-electronic interface tolerances.

One prior art device requires a pointer that breaks a plane of light to the sensors. The pointer is positioned perpendicular to the plane of light. Pointers would typically be thin cylindrical objects, like pencils, fingers, etc. The ability to determine a coordinate is determined by the diameter of the pointer and the quality of the optics.

A need exists to provide simplified electronic inputs which provide versatility and accuracy using common objects as pointers.

SUMMARY OF THE INVENTION

The present invention is an input device. Keys are not pressed with the fingers, but instead any opaque object that has a regular shape can be used for an input. Using an object provides for hands-free operation. The user does not have to put down the object being handled for data entry, because the object is used at part of the data entry device. Boxes, paper, cards, magazines, books, etc. are examples of suitable objects. Movement and position information is detected and can be translated to represent discrete keys. In standard keyboards, each key is represented by an on/off state; position and motion cannot be detected.

In the present invention multiple sensors are involved in detecting a key. Each sensor is related to groups of keys. The key in the present case is a particular coordinate. The use of a sensor for multiple keys is much more efficient than the use of one or multiple sensors for one key. 36 sensors in the present invention have a theoretical limit of 630 keys. The number of keys possible for this invention is $(n^2-n)/2$, where n is the number of sensors in the linear array. Four sensors provide six keys; six sensors provide fifteen keys.

In the present invention, ambient light is used instead of a special light source. Since multiple sensors make up many keys, each individual key need not be uniquely fabricated and interconnected. Keys are interchangeable. Sensors in the present invention have few limitations.

The present invention is not a keyboard-type data entry system. It is more similar to pointing devices, such as digitizers and mice. Key-type data entry is possible in this system by assigning coordinates to represent keys.

Among the improvements of the invention are:
1. Higher resolution, more keys per sensor.
2. Object activation, no specific input apparatus required.
3. Motion and position sensing, not just on/off.
4. Use of ambient light source.
5. Use of standard optical sensors.

The present invention functions electronically. Some of the improvements and differences are, for example:
1. No moving parts: The present invention has no moving parts.
2. No special optics: The present invention uses an array of sensors with ambient light.
3. No synchronization: In the present invention, each sensor is a coordinate and no synchronization is necessary.
4. Improved Motion Detection: The rate of change that the present invention can detect is limited only by the speed of the electronics.
5. Improved Resolution: In the present invention, resolution is essentially determined by the size and number of sensors in the array.
6. Varied Pointing Devices: Pointers used with the present invention are placed parallel to the surface of the enclosure.

The invention requires objects that have a flat surface and are regular in shape, as paper, books, cards, boxes, envelopes, etc. Size is not important. The invention uses the body and sides of an object to determine its coordinates. It is well suited for translational detection. An additional row or rows of sensors detects rotational changes.

A preferred embodiment of the present invention is an electronic input device composed of a single row of optical sensors arranged diagonally and optionally, a legend located above the diagonal row of sensors. The use for this invention is similar to that of mice, joy sticks, light pens, digitizers, touch screens and track balls that are in wide use today. The present invention allows the users to interact with a computer system by using any object that is opaque and has a corner formed by two straight edges as a pointer. Objects can be made of paper, plastic, wood, metal, or just about anything as long as it is opaque and has a corner. Paper, envelopes, cards, magazines and books are examples of objects that are well suited for this invention. The size and weight of the usable objects are limited by the ability of the operator to maneuver the object over the sensors. The number of sensors needed in the diagonal is determined by the resolution required for a particular use.

By using a non-dedicated object as a pointer, the operator can use one or both hands to manipulate the object while interacting with the computer. The use of a non-dedicated object and the number of different objects that may be used as a pointer makes this invention unique from other devices. Other devices require specific pointer apparatuses. The resolution of this device is not limited to the size of the pointing device, but is related to the number of sensors in the diagonal.

The legend is not necessary but is used as a guide to the operator. The legend may be composed of numbers, alphabets, words or other symbols pertinent to the use. An example of the invention is used as an alphanumeric data entry device. To use the invention, the operator places the corner of the object on a location on the legend corresponding to the desired input. For example, in the selection of the letter "R", the object covers specific sensors from ambient light. By detecting the sensors that are covered, coordinates for the corner can be determined. The coordinates can then be transmitted to a computer system. The operator may be required to position the object consistently with respect to the sides. The intersection of the sides with the sensors corresponds to the coordinates of the corner of the object. Thus, each position on the legend has a unique coordinate. Direction and movement of the object is detected by monitoring changing coordinates.

The operator does not need to touch or manipulate a specific device. A wide range of pointer objects can be used. High resolution is provided.

The present device can be used in many applications of computer automation where a fixed input device is impractical to use or where the handling of objects would facilitate the use of the object as the pointing device.

A computer input device uses an ordinary sheet material such as a card, letter or envelope to select and point to a symbol. A remote portion of the sheet material covers sensors which sense available ambient light. Uncovered sensors provide background light information. A single sensor is associated with multiple symbols and is associated with symbols in at least two specific groups of symbols.

A processor is connected to a demultiplexer and a multiplexer, and the demultiplexer and multiplexer are connected to individual sensors. Biasing resistors are connected to individual sensors. The processor selects a pair of connectors from the demultiplexer and multiplexer, thus sampling a particular sensor. The output of that sensor is converted a digital signal, which is sent to the processor and stored in a random access memory.

After sufficient sensors have been interrogated, the processor provides an output which is particularly related to the sensor or group of sensors which are covered by the pointer sheet, and which is specifically related to a symbol pointed to by the pointer sheet. In one embodiment, the processor output is displayed as a particular information. In one embodiment, the processor output illuminates lamps over individual receiver bins to indicate the receiver bin in which the pointer piece should be deposited.

A preferred computer input has a linear array of regularly spaced sensors and a field of regularly arranged symbols positioned apart from the sensors. One sensor or a group of sensors with an object as a corner of an object is pointed to a particular symbol within the field. A sensing network connected to the sensors senses which of the sensors have been covered by the object. An output is connected to the sensing network for supplying information from the sensing network to a computer.

Preferably the field is a triangular field, and the linear array is a line of plural sensors spaced from one edge of the triangular field. The preferred triangular field is a right triangular field having an hypotenuse as one edge, and the array of sensors is arranged in a line spaced parallel to the hypotenuse.

The preferred linear array is an array of optical sensors for sensing ambient light. A transparent window covers the linear array of optical sensors in a preferred embodiment. Preferably the sensing network comprises an electronic network.

A preferred electronic network includes a processor, a multiplexer and a demultiplexer, and address lines connected from the processor to the multiplexer and demultiplexer. Plural lines individually connect each sensor to the demultiplexer, and plural lines individually connecting each sensor to the multiplexer for activating each sensor when a demultiplexer and multiplexer input pair is addressed by the processor for sensing an output of a particular sensor. An analog-to-digital converter connected to the multiplexer sequentially converts sensor output level of each sensor to a digital value. The value is supplied to the processor for providing the digital value to the processor. Preferably a plurality of biasing resistors separately connected to the sensors bias the sensors.

The symbols are preferably arranged in columns and rows in the field, and in one embodiment each sensor is associated with one column and one row.

In one embodiment, a display screen positioned adjacent the touch plate displays information related to the specific symbol pointed to by a pointer sheet overlying the sensor array.

In another embodiment, a sorting bin is connected to the touch plate. The sorting bin has a plurality of receivers for receiving pointer pieces. A plurality of indicator lights individually are associated with the receivers for indicating the appropriate receiver to receive a pointer piece. The pointer piece is first placed on the touch plate with a corner contacting a symbol in the field. A light is illuminated on a receiver to indicate where that piece should be placed.

A preferred computer input distribution method uses a touch plate having a triangular field and having a plurality of rectangularly arranged individual symbols within the field. A linear array of ambient light optical sensors is spaced along one edge of the triangular field. A plurality of sensors is in the linear array, one sensor being arranged with more than one group of symbols. The field and the array are positioned on a plate. A rectangular piece to be sorted is placed on the plate over the sensors, with a corner pointing toward a symbol. A processor connected to the sensors in the linear array determines which sensor or group of sensors is covered by the pointer piece and inputs information uniquely associated with that sensor group. A display connected to the processor displays information related to the covered sensor or sensors and consequently to the symbol selected by the pointer piece.

The preferred method of inputting information to a computer, comprising pointing to a symbol in a field of symbols with a corner of a sheet or object, preventing impingement of ambient light on sensors with a portion of the sheet spaced from the pointing corner, and inputting information to a computer related to the sensors covered by the portion of the sheet.

A preferred optical pointer input device is illustrated in the following diagrams.

These and further and other objects and features of the invention are apparent in the disclosure, which includes the above and ongoing written specification, with the claims and the drawings.

BRIEF DESCRIPTION OF THE DRAWINGS

FIG. 3 is a block diagram of possible circuitry to implement the present invention.

FIG. 3a illustrates a sensor.

FIG. 5 is a table of values to illustrate a method of determining coordinates.

FIG. 6 is a schematic detail of one application.

FIG. 6a is a schematic detail of a touch plate.

DETAILED DESCRIPTION OF THE DRAWINGS

Figure 1:
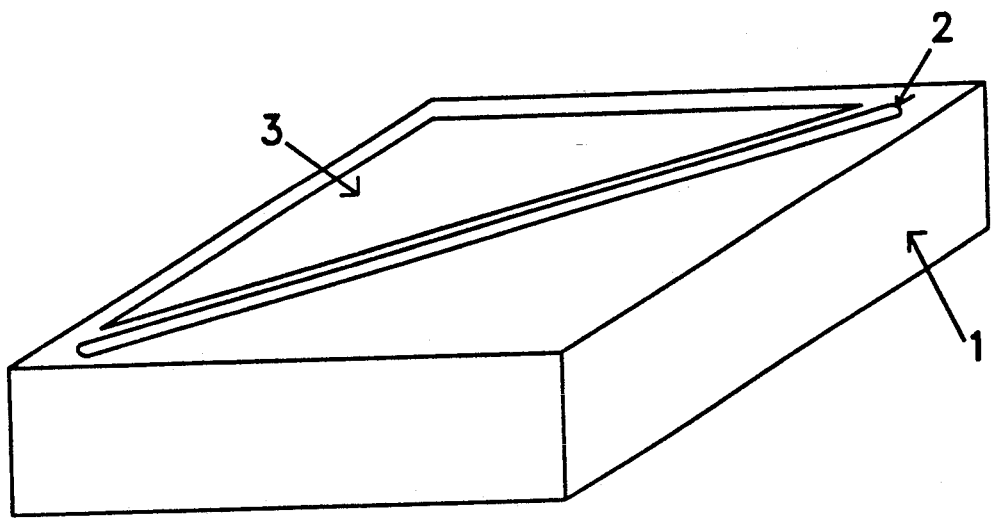
FIG. 1 is a typical embodiment of the invention.

FIG. 1 is a perspective view showing an opaque enclosure 1, a transparent window 2, and a triangular legend 3. Enclosure 1 contains the sensors and associated electronics to read and process the state of the sensors. Transparent window 2 exposes the array of sensors located in the enclosure. Legend 3 is application specific and contains symbols that correspond to coordinates. Alphabets, numbers or other symbols may be placed on the legend.

Figure 2:
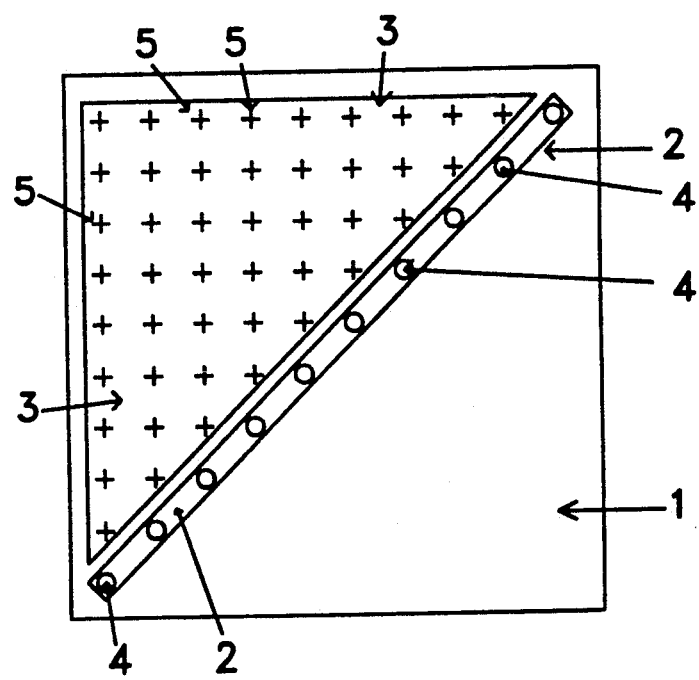
FIG. 2 is a top view of the present invention illustrating a legend and array of sensors.

FIG. 2 is a top view of the invention. Discrete sensors 4 are directly beneath transparent window 2. Legend 3 is positioned so that the hypotenuse of the legend is parallel to transparent window 2. The application-dependent symbols 5 are arranged in rows and columns within legend 3. The spacing between rows and columns is dependent on the number of sensors and the desired resolution.

FIG. 3 is a block diagram of electronics to implement an optical pointer input device. Processor 6 outputs address lines to demultiplexers 8 and analog multiplexer 10. Pull-up resistors 7 linearly bias sensors 4. A sensor 4, as shown in FIG. 3a, is activated when a corresponding demultiplexer and multiplexer input pair is addressed by processor 6. Analog to digital converter 11 converts sensor 4 voltage levels to a digital value. Processor 6 reads the digital values for each sensor 4 and stores and/or processes the values for calibration, coordinates and motion detection. ROM 12 and RAM 13 are for processor 6 program and data storage respectively.

Figure 4:
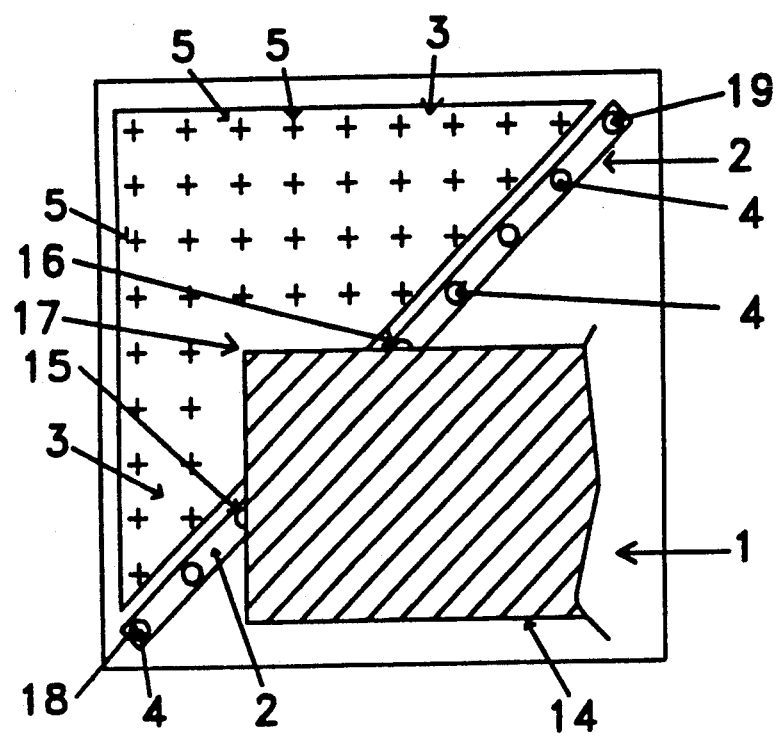
FIG. 4 illustrates the detection of an object.

FIG. 4 illustrates an object 14 on enclosure 1. Object 14 points to symbol 17 on legend 3. The edges of object 1 cover sensors 15 and 16. As an example, sensor 18 corresponds to coordinate 1 and sensor 19 corresponds to coordinate 10. The sensors between 18 and 19 correspond to coordinates 2 through 9, respectively. Thus the coordinates 1 through 10 are associated with each sensor. Since sensors 15 and 16 are covered, symbol 17 would be at coordinates 3 and 6. This example illustrates a one-to-one correspondence between sensors and coordinates. In any particular implementation, the number of sensors and coordinates can be varied where a range of sensors can represent a coordinate. The absolute maximum, however, is a one-to-one correspondence.

FIG. 5 illustrates example digital values that could represent the object in FIG. 4. Sensor coordinates 20 correspond to sensors 4, 18 and 19 in FIG. 4. Ambient light digital values 21 are stored for calibration when no object is detected. Digital values 22 are read and adjusted to digital values 23 by subtracting ambient light values 21. Values 23 are processed for edge detection to produce coordinates 24. By reading and processing coordinates at high rates, motion and direction can be determined by the changing coordinates.

A touch plate is generally indicated by the numeral 30 in FIG. 6a. The touch plate includes the base 31 and the sensor strip 32 next to the triangular field 33 of symbols 35. A display 37 is provided on the touch plate 30 to display information related to the symbol selected. For example, as shown in the drawing, the touch plate may display "Second Avenue" and "47th". The user may then place the piece which he placed on the touch plate directly in the bin which is related to No. 47 and Second Avenue.

In a preferred embodiment, the touch plate is enclosed in a box 38.

A sorter rack 40 may be used with the touch plate 30 as shown in FIG. 6. Preferably the sorter rack 40 has a plurality of receivers 41 or bins 41 in which to place the pieces that are coded by the touch plate. For example, when sorting mail pieces, the mail pieces are first pointed at a symbol on the touch plate, and then placed in a bin. The particular bin 41 in which to place the pieces is indicated by lights 43, which are associated with the bins. The lights may be aligned in two rows 44 and 46, as shown in FIG. 6. Alternatively, an individual light 47 may be placed atop or within each bin to illuminate the bin in which the piece should be placed.

Rack 40 may be a standard rack, such as conventionally used to sort mail, to which has been added lighting plates 44 and 46 or to which has been added a series of individual bin illuminators 47.

The invention requires no fixed prior scheme and may be configured to meet individual needs. When using the invention, both hands are free for mail handling and it is easy to train part-time or temporary help in the use of the system in minutes.

The system is low cost, and no extraction codes are necessary. Removable memory modules allow sort plans to be switched in seconds. For example, the touch plate 30 shown mounted on bin 40 may be removed and replaced with another touch plate with a different memory related to the bins, so that the bin may be reused to sort a different group. The invention is small in size and installs into one bin.

The invention provides an electronic device that makes manual mail distribution easy. Address and carrier information is stored in the touch pad memory and can be recalled by using an envelope and special sensors. By moving the envelope over the sensors, a particular street can be found in seconds. Once the desired street is located, lights, for example LEDs, are illuminated to indicate the appropriate bin for envelope insertion. The present invention points out the correct bin without memorization schemes.

The system can be configured for specific needs. Street addresses, ranges and bin numbers are determined by the user. Address information can be installed and optimized for a particular mail mix and addressing characteristics.

While the invention has been described with reference to specific embodiments, modifications and variations of the invention may be constructed without departing from the scope of the invention, which is defined in the following claims.

We claim:

1. A computer input apparatus having a linear array of regularly spaced sensors, a field of regularly arranged symbols positioned apart from the sensors, for covering with an object one sensor or a group of sensors as a corner of said object is pointed to a particular symbol within the field, a sensing network connected to the sensors for sensing which of the sensors have been covered by said object, and an output connected to the sensing network for supplying information from the sensing network to a computer, wherein the field is a triangular field, and wherein the linear array is a line of sensors spaced from one edge of the triangular field.

2. The apparatus of claim 1, wherein the triangular field is a right triangular field having a hypotenuse as one edge, and wherein the array of sensors is arranged in a line spaced parallel to the hypotenuse.

3. The apparatus of claim 1, wherein the linear array is an array of optical sensors for sensing ambient light, and further comprising a transparent window covering the linear array of optical sensors.

4. The apparatus of claim 3, wherein the sensing network comprises an electronic network.

5. The apparatus of claim 4, wherein the electronic network comprises a processor, a multiplexer and a demultiplexer, and address lines connected to the multiplexer and demultiplexer, plural lines individually connecting each sensor to the demultiplexer, and plural lines individually connecting each sensor to the multiplexer for activating each sensor when the demultiplexer and multiplexer input pair is addressed by the processor for sensing an output of each sensor.

6. The apparatus of claim 5 further comprising an analog-to-digital converter connected to the multiplexer for converting sensor output level of each sensor to a digital value and connected to the processor for providing the digital value to the processor.

7. The apparatus of claim 6, further comprising a plurality of biasing resistors separately connected to the sensors for biasing the sensors.

8. The apparatus of claim 1, wherein the symbols are arranged in columns and rows in the field and each sensor is associated with one column and one row.

9. The apparatus of claim 1, wherein the apparatus is mounted on a touch plate, and further comprising a display screen positioned adjacent the touch plate for displaying information related to the specific symbol pointed to by a card overlying the sensor array.

10. A computer input apparatus having a linear array of regularly spaced sensors, a field of regularly arranged symbols positioned apart from the sensors, for covering with an object one sensor or a group of sensors as a corner of said object is pointed to a particular symbol within the field, a sensing network connected to the sensors for sensing which of the sensors have been covered by said object, and an output connected to the sensing network for supply information from the sensing network to a computer, wherein the apparatus is mounted on a touch plate, further comprising a sorting bin having a plurality of receivers for receiving pointer pieces, and having a plurality of indicator lights severally and individually associated with the receivers for indicating by the indicator lights the appropriate receiver to receive said object when said object is placed on the touch plate with said corner contacting a symbol in the field.

11. A computer input distribution apparatus, comprising a touch plate having a triangular field and having a plurality of rectangularly arranged individual symbols within the field, a linear array of ambient light optical sensors spaced along one edge of the triangular field, a plurality of sensors in the linear array, one sensor being arranged with more than one group of symbols, the field and the array being positioned on a plate for aligning a rectangular piece to be sorted on the plate over the sensors, the rectangular piece having a pointing corner for pointing toward a symbol, a processor connected to the sensors in the linear array for determining which sensor or group of sensors is covered by the pointing corner and for inputting information uniquely associated, and a display connected to the processor for displaying information related to the covered sensor or sensors and to the symbol pointed to by the pointing corner.

* * * * *